United States Patent [19]
Gao et al.

[11] Patent Number: 6,162,591
[45] Date of Patent: Dec. 19, 2000

[54] PHOTOLITHOGRAPHY PROCESS WITH GAS-PHASE PRETREATMENT

[75] Inventors: Tsai-Sheng Gao, Hsinchu; Dong-Yuan Goang, Chung Li, both of Taiwan

[73] Assignee: Industrial Technology Research Institute, Taiwan

[21] Appl. No.: 09/145,170

[22] Filed: Sep. 1, 1998

[51] Int. Cl.$^7$ .................................. G03F 7/26; G03F 7/38
[52] U.S. Cl. ............................................. 430/325; 430/323
[58] Field of Search ..................................... 430/327, 313, 430/322, 323, 325, 324

[56] References Cited

U.S. PATENT DOCUMENTS 5,292,623  3/1994  Kemp ....................................... 430/313
5,407,786  4/1995  Ito ............................................. 430/313

*Primary Examiner*—Kathleen Duda
*Attorney, Agent, or Firm*—McDermott, Will & Emery

[57] ABSTRACT

The present invention discloses a photolithography process with a gas-phase pretreatment before the development of photoresist to increase the depth of focus (DOF) of an isolated-line pattern on a substrate. A photoresist layer is coated on a substrate by using spin-on technology. Then, an exposure process is performed on the photoresist layer through a reticle to transfer a pattern of the reticle to the photoresist layer. Additionally, a gas-phase pretreatment is performed on the photoresist layer before or after the exposure process to harden the surface of the photoresist layer. Finally, a developing process is performed to form a pattern on the substrate.

8 Claims, 9 Drawing Sheets

PHOTOLITHOGRAPHY PROCESS WITH GAS-PHASE PRETREATMENT

FIELD OF THE INVENTION

The present invention relates to a deep ultra-violet (DUV) photolithography process, and more specifically, to a photoresist pretreatment in a photolithography process in order to accurately transfer an isolated-line pattern on the photoresist layer.

BACKGROUND OF THE INVENTION

Accompanying with the development of integrated circuits, the line-width of ultra-large-scale integrated circuit is smaller than quarter micron meters. A traditional photolithography process is applied to the formation of quarter-micron-meters lines but a line being narrower than that. In the traditional deep ultraviolet (DUV) photolithography process, an isolated-line pattern has a smaller depth of focus (DOF) than a dense-line pattern. Some approaches are tried to solve the above issue for the isolated-line pattern.

A next-generation DUV stepper machine uses a light, which has a wavelength about 0.193 nanometers, to expose photoresist. At the recent years, the DUV stepper machines, which are popular used in factories, use light that has a wavelength about 0.248 nanometers. Using the next-generation stepper machine, the DOF of the isolated line will be increased. Nevertheless, the new stepper machine is not developed very well.

Other approach to increase the DOF of the integrated circuits is to use a phase-shifting mask during a photolithography process. A phase-shifting mask (PSM) is consisted of several masking layers and attenuated layers. The phase-shifting mask has a special structure in order to an electrical field, which has a good contrast, being applied on the mask when the light of a stepper machine transmits the mask. However, the cost for manufacturing a phase-shifting mask is so expensive. Thus, the phase-shifting mask is not popular with factories. Additionally, sub-resolution assisted features are placed around an isolated line on a mask so that the DOF of the isolated line could be increased. To fabricate the assisted features on a mask needs complex calculations and designs. So, this approach is not available for semiconductor's factories.

A surface pretreatment is used to harden the surface of a DUV photoresist layer. Conventionally, the surface pretreatment is performed by using DI water or developer and it is named a liquid-phase pretreatment. The photoresist layer is dipped in DI water or developer before the developing process of the photoresist layer. But, the liquid-phase pretreatment is rough to the DUV photoresist layer. The profile of the DUV photoresist of an isolated line, which is exposed, after the liquid-phase pretreatment is T-shape. As the isolated-line DUV photoresist layer is T-shape, the critical dimension of the DUV photoresist is not definitely determined. Besides, the liquid-phase pretreatment is not uniform enough. Referring to FIG. 1, a cross section's view of a photoresist layer 10 not being treated is shown. In spite of the photoresist layer 10 has a sharp profile but the top surface of the photoresist layer 10 are round and the critical dimension of the isolated line under the photoresist layer 10 will be hard to control during following etching processes. Referring to FIG. 2, a cross sectional view of a DUV photoresist layer 10, which is treated by using a liquid-phase pretreatment and is developed, is shown and it is a T-shape.

According to the above discussion, a new surface pretreatment for the DUV photoresist is needed to increase the DOF of an isolated-line pattern.

SUMMARY OF THE INVENTION

A gas-phase pretreatment to increase the depth of focus of an isolated-line pattern in photolithography process is disclosed in the present invention. A lithography technology with a gas-phase process comprises following steps for forming a pattern on a substrate. A resist layer is applied on the substrate. An exposure process is performed on the resist layer. A gas-phase pretreatment is then performed on the resist layer to harden a surface of the resist layer. A developing process is performed on the resist layer to form the pattern on the substrate.

The gas-phase pretreatment is performed in an ambient of base gas. The temperature and concentration of the base gas is controlled and the processing time of the pretreatment is accurately controlled, too. After the gas-phase pretreatment of the resist layer, the depth of focus of an isolated-line pattern is significantly increased.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention discloses a gas-phase pretreatment for DUV photoresist to increase the depth of focus of an isolated line in photolithography processes. The gas-phase pretreatment is performed in the photolithography machine, such as a track system. DUV photoresist is putted in an ambient of base gas. The processing condition of the base gas is well controlled to harden the surface of the DUV photoresist. In the following description, a process to define a pattern on a substrate will be explained.

Figure 7A:
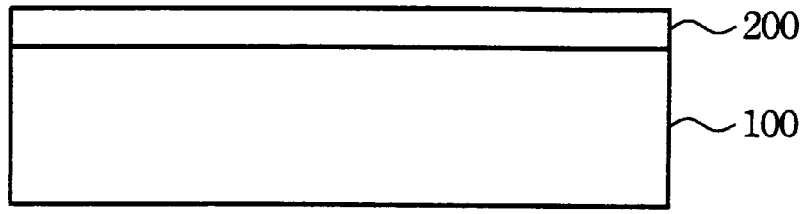
FIGS. 7A to 7I shows a cross section view of a substrate, a photoresist layer is patterned on the substrate by using a lithography process in accordance with the present invention.
Figure 7B:
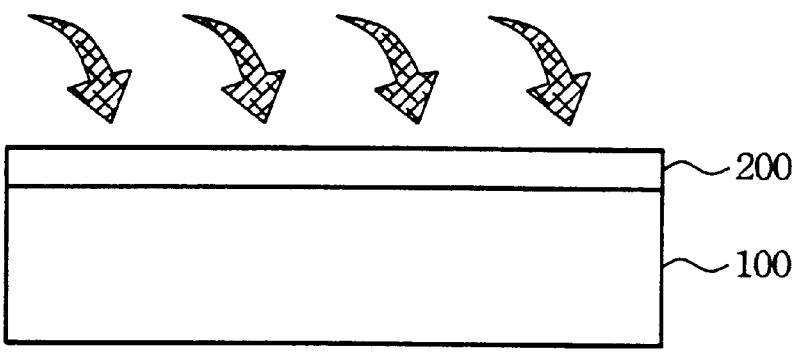

Firstly, thin film 200 is deposited on the substrate 100, as shown in FIG. 7A. The thin film 200 will be patterned in a photolithography process. Referring to FIG. 7B, a pre-bake or prime process is performed on the surface of the thin film 200. The pre-bake process is used to ensure good photoresist adhesion by removing moisture from the surface of the wafer and is performed by heating the wafer caused the moisture to evaporate from the surface. Besides, the prime process is used to aid in the adhesion of photoresist. A chemical hexamethyldisilizane (HMDS) is used to promote adhesion of the photoresist to the surface of the wafer. HMDS is applied to the heated wafer by introducing nitrogen saturated with HMDS vapor into the vapor prime oven chamber. Then, a chill process is performed to bring the substrate 100 to a stable, constant temperature before applying photoresist. The chill process is performed in a chill plate of a track system.

Figure 7C:
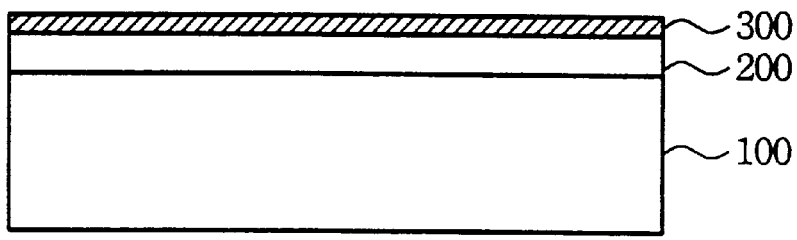
Figure 7D:
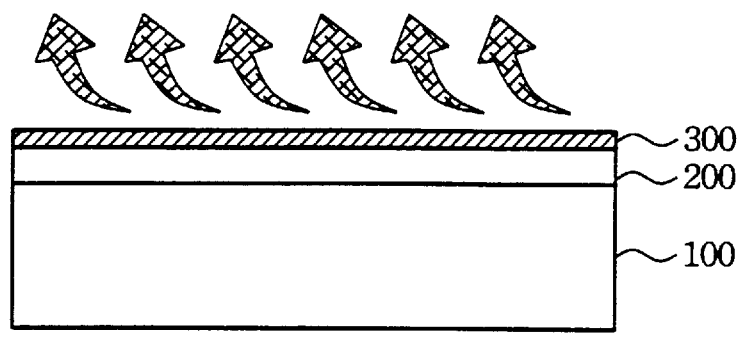

Referring to FIG. 7C, a photoresist layer 300 is coated onto the surface of the thin film 200. Typically, the photoresist layer 300 is deep ultraviolet (DUV) photoresist. Referring to FIG. 7D, a soft-bake process is used to dry the photoresist layer 300 by removing most, but not all, of the solvent. Evaporating the solvent converts the photoresist layer to a mechanically stable film. The soft-bake process is performed in a vacuum bake chamber of the track system. After the soft-bake process, a chill process is used again to bring the substrate 100 to a stable temperature.

Figure 7E:
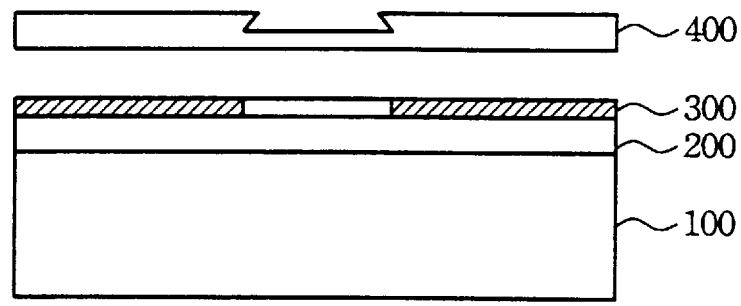

Referring to FIG. 7E, UV light transmits a reticle 400 to transfer an image from the reticle to the photoresisit layer 300, the reticle 400 is accurately aligned and focused to the substrate 100. After the exposure of the photoresist layer 300, a post-exposed bake is performed to stabilize the photoresist, specifically to the exposed and unexposed areas of the photoresist layer 300. A third chill process is used to bring the substrate 100 to a stable, constant temperature before applying the developer solution. The post-exposed bake and the third chill process are performed in a vacuum bake chamber and on a chill plate of the track system, respectively.

Figure 7F:
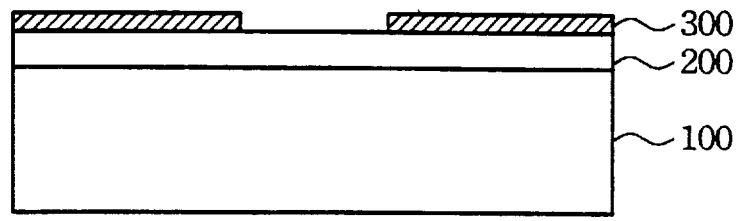

Referring to FIG. 7F, a develop process is performed to removes the unwanted portion of the photoresist layer 300 by using a developer solution. It is noted that positive photoresist developer removes the exposed photoresist coating and negative photoresist developer removes unexposed photoresist coating. In some processes, a visual inspection (develop check) is done to identify defects in the photoresist layer 300. Critical dimensions (CDs) of the photoresist layer 300 are measured, and an alignment check may also be done.

Figure 7G:
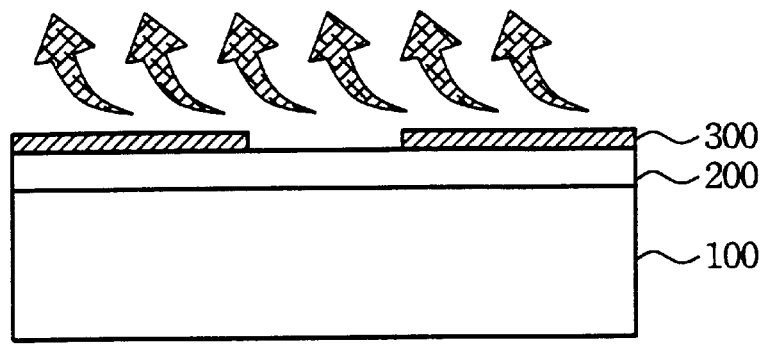

Referring to FIG. 7G, the substrate 100 is baked in the vacuum chamber or a hot-plate chamber to remove moisture from the wafer surface and harden the pattern of the photoresist layer 300. The process to bake the substrate 100 after the developing process is indicated as a hard bake process. The substrate 100 is then chilled on a chill plate of the track system to cool the wafer before transferring it back to the indexer cassette.

Figure 7H:
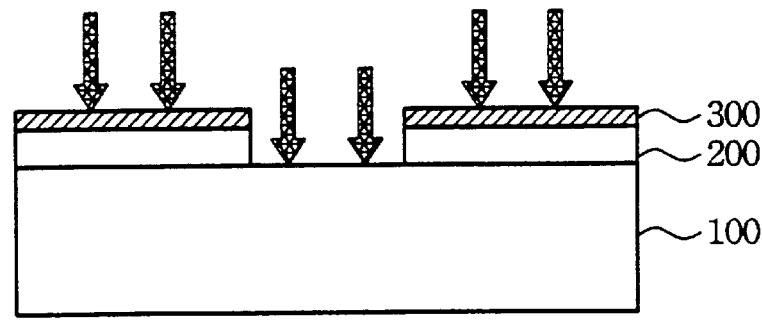
Figure 7I:
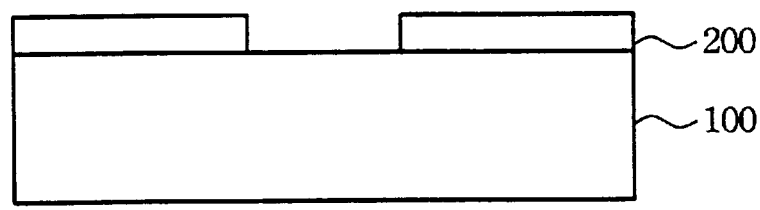

Referring to FIG. 7H, the thin film 200 is etched by using the photoresist layer 300 as an etching mask. The etching process to etch the thin film 20 is a dry or wet etching. After the etching process, a pattern is formed in the thin film 200. Lastly, the photoresist layer 300 is stripped, as shown in FIG. 7I.

The gas-phase pretreatment of the photoresist layer 300 is inserted into the above process flow. The gas-phase pretreatment could be performed before the developing process that is shown in FIG. 7F. That is, the gas-phase pretreatment can be done before or after the exposure of the photoresist layer 300, to harden the surface of the photoresist layer 300. The gas-phase pretreatment is performed in an ambient of base gas. In a preferred embodiment, the base gas is amine ($NH_4OH$) gas or a gap that has a pH value between about 7.1 and 13, which has a temperature between about 15 and 250 centigrade degrees, a concentration between about $10^{-3}$ ppm and 10 mole/cm$^3$. In a case, the processing time of the gas-phase pretreatment is between about 1 and 120 seconds.

Figure 5:
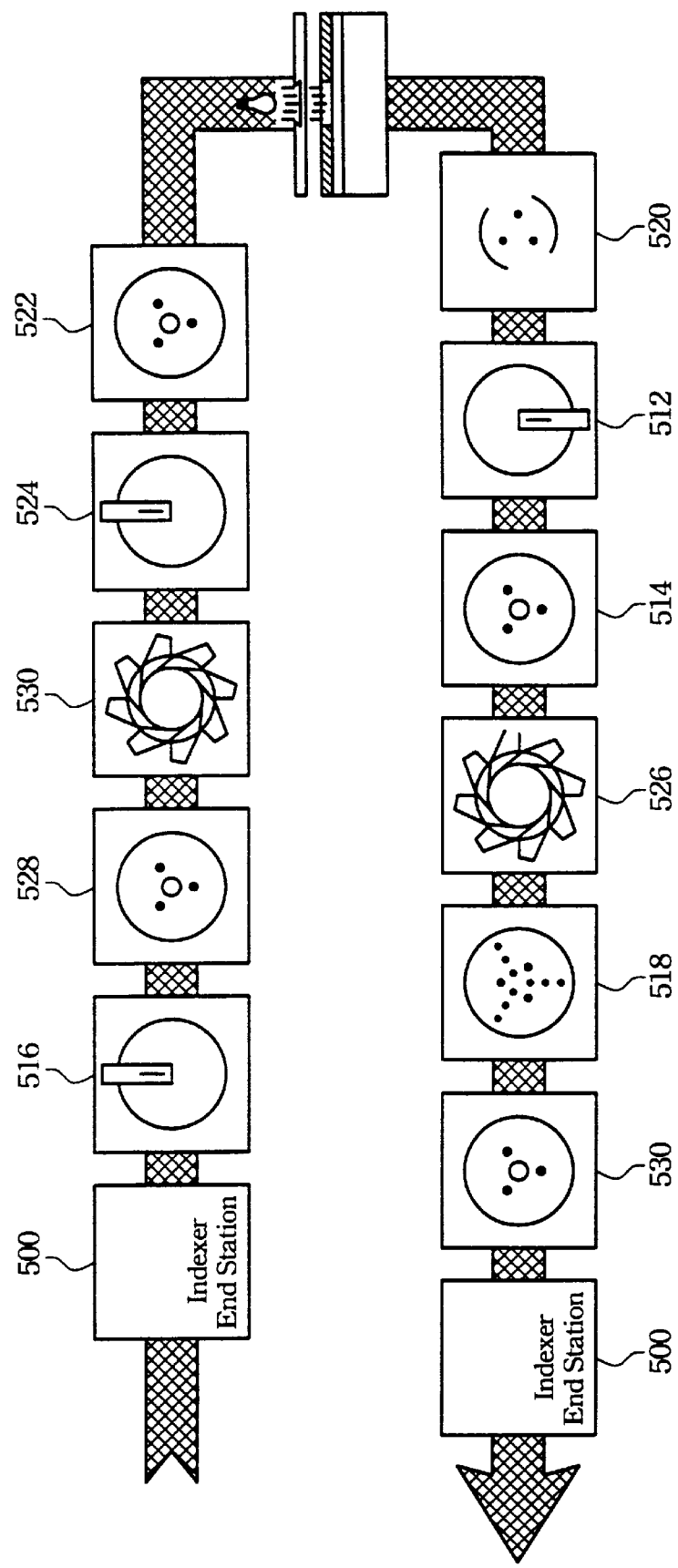
FIG. 5 shows a flow of a lithography process including the coating, the bake, the exposure and the chill of a photoresist layer in accordance with the present invention.

Referring to FIG. 5, a process flow of a photolithography process is shown. A wafer is took out from an indexer end station 500 and enters a vapor prime chamber 516. In the vapor prime chamber 516, the wafer is baked, as shown in FIG. 7B. The wafer is then putted on a chill plate in a chill pate chamber 528 to cool the wafer down. After the pre-bake and chill process, photoresist is coated in a coating chamber 530 by using spin-on. The coating of the photoresist is shown in FIG. 7C. Afterwards, the wafer enters a vacuum-bake chamber 524 and a soft-bake process is performed in the vacuum-bake chamber 524. The wafer is then cooled down on a chill plate in a chill-plate chamber 522.

The photoresist is exposed through a reticle to transfer a pattern to the photoresist. The exposure process is done in a stepper chamber (not shown). After the expose process, the wafer leaves the track system and enters into an interface chamber (not shown) between the stepper chamber and the track system through a shuttle 600, and the wafer then enters into the track system. Afterwards, a post-expose bake process is performed and a chill process is done to bring the wafer to a stable temperature, as shown in the FIG. 7E. The post-expose bake and the chill process are done in a vacuum bake chamber 512 and in a chill-plate chamber 514, respectively.

A develop process, as shown in FIG. 7F, is performed in a developer chamber 526. Then, the wafer is putted on a hot plate in a hot-plate chamber 518 to harden the photoresist and to remove moisture of the photoresist. Finally, a chill process is performed in an indexer-end-station chill chamber 530. After the final chill process, the wafer returns the indexer end station (IES) 500.

The gas-phase pretreatment could be performed in the vapor-prime chamber 516, vacuum-bake chamber 524, chill-plate chamber 528, 514, interface chamber or stepper chamber. The base gas for the gas-phase pretreatment is introduced into the module or chambers, which is used to control a processing condition, such as the temperature and concentration of the base gas. Besides, the processing time of the gas-phase pretreatment must be well controlled, too.

Figure 6:
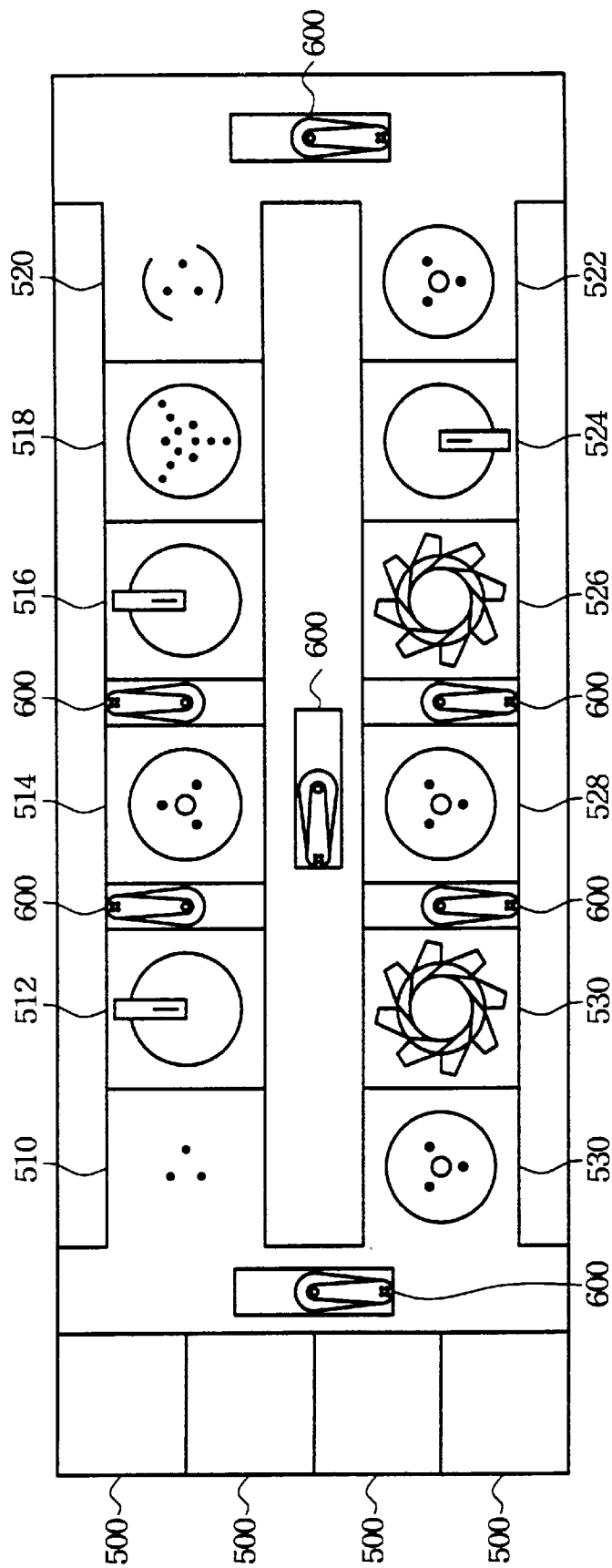
FIG. 6 is a top view of a lithography machine including several chamber in accordance with the present invention.

Referring to FIG. 6, a top view of the track system is shown. The track system comprises several chambers, like the vacuum-bake chambers 512, 524, chill-plate chambers 514, 528, 522, vapor-prime chamber 516, hot-plate chamber 518, developer chamber 526, coater chamber 530, indexer end stations 500, IES-stage chamber 510 and IES-chill chamber 530. A stepper chamber (not shown) is attached with the track system and wafers are transferred from the track system to the stepper chamber through a shuttle and several indexer end stations 500 are attached with the track system. Several shuttles 600 are placed between the chambers for transferring wafers.

Figure 3:
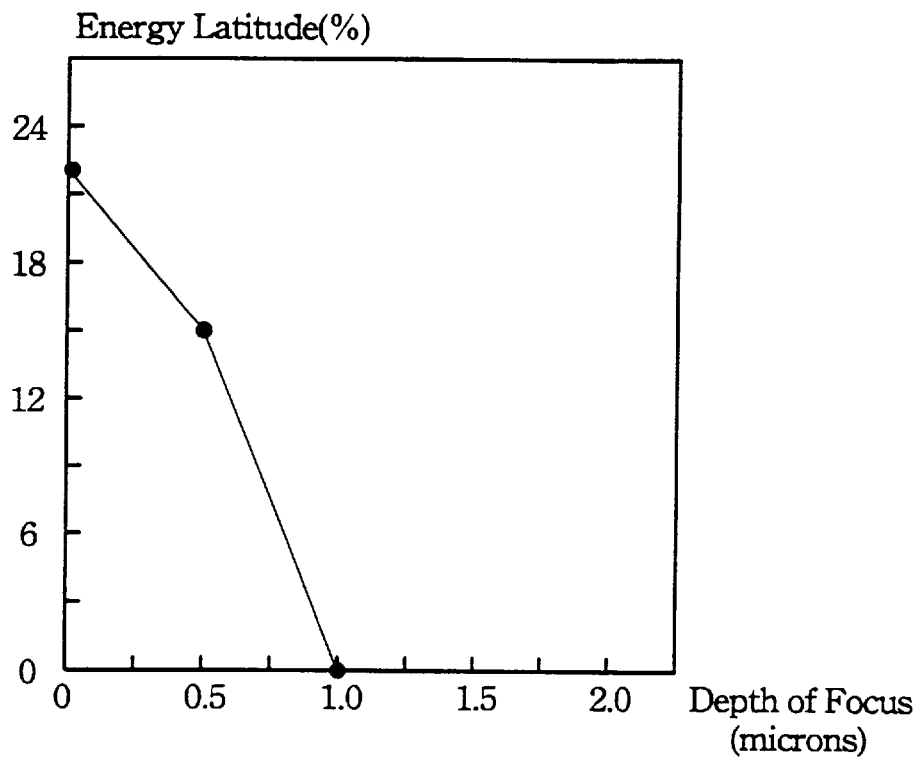
FIG. 3 shows the relation between a depth of focus of an isolated-line pattern and an energy latitude of a photolithography process for forming the isolated-line pattern in accordance with prior art.
Figure 4:
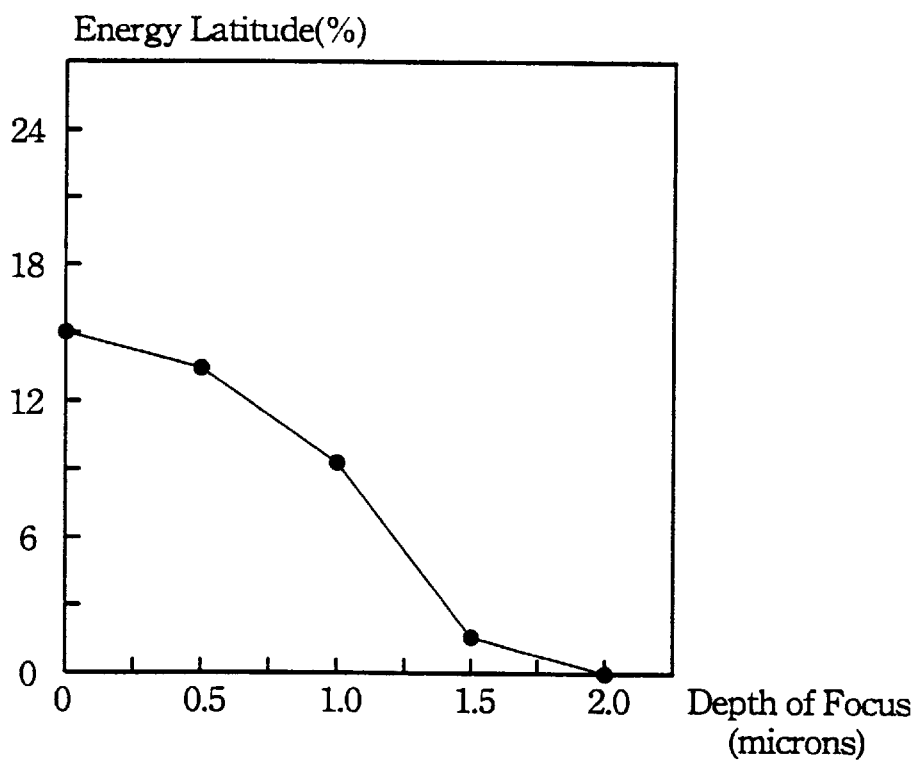
FIG. 4 shows the relation between a depth of focus of an dense-line pattern and an energy latitude of a photolithography process for forming the dense-line pattern in accordance with prior art.
Figure 8:
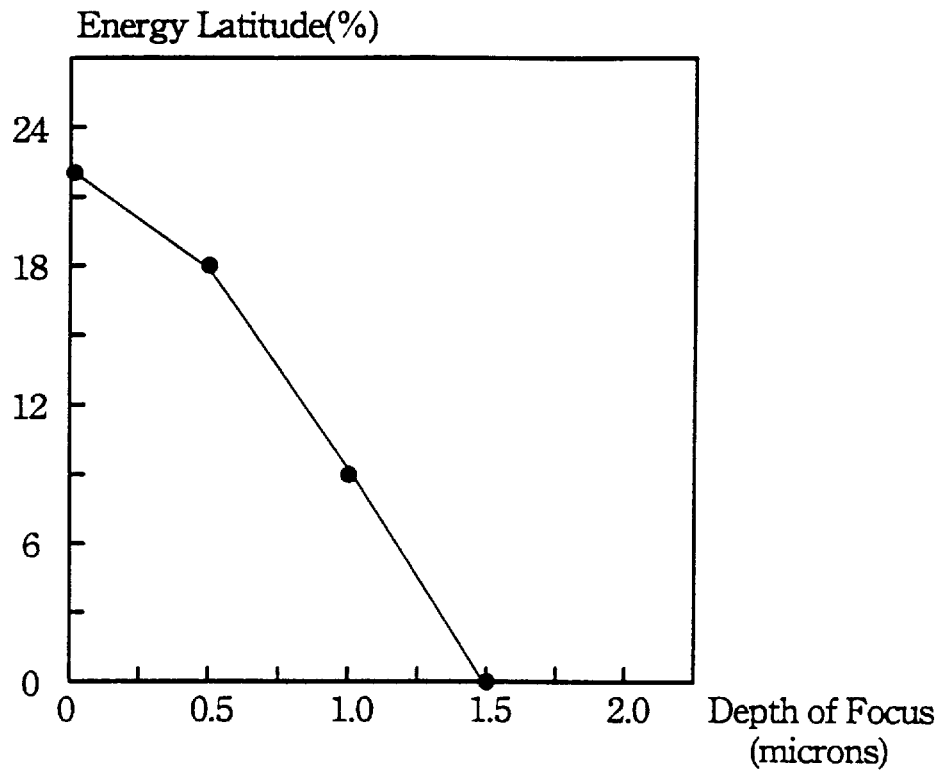
FIG. 8 shows the relation between a depth of focus of an isolated-line pattern and an energy latitude of a photolithography process for forming the isolated-line pattern in accordance with the present invention.
Figure 9:
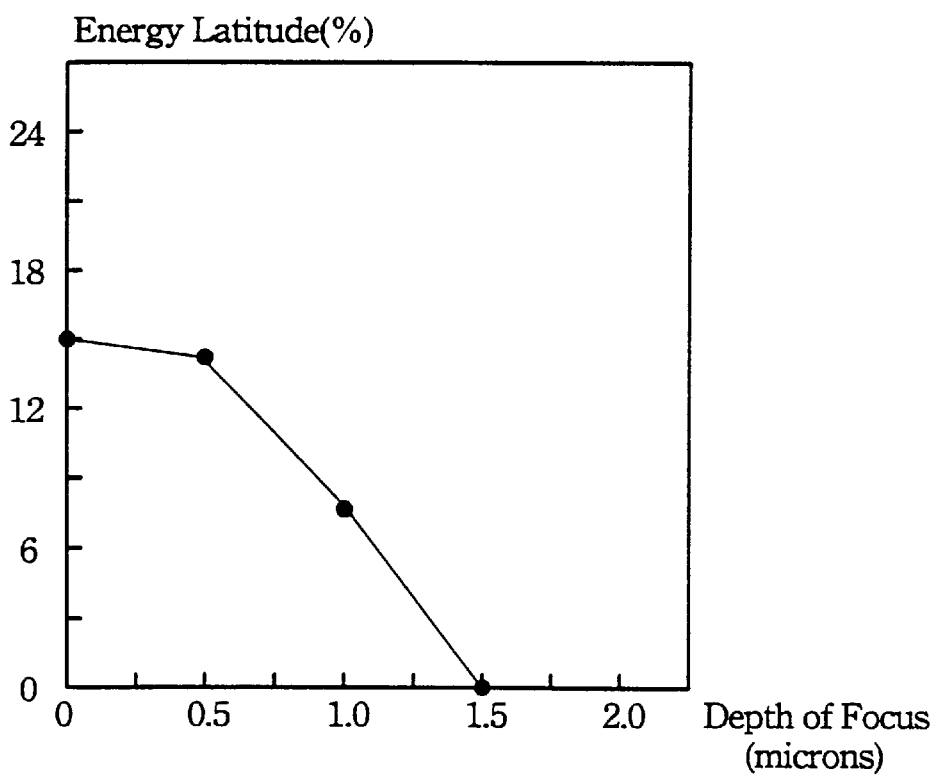
FIG. 9 shows the relation between a depth of focus of an dense-line pattern and an energy latitude of a photolithography process for forming the dense-line pattern in accordance with the present invention.

Referring to FIGS. 3 and 4, the relation of the energy latitude to the depth of focus (DOF) of an isolated-line pattern and an dense-line pattern without any pretreatment is respectively shown. Referring to FIG. 8, the relation of the energy latitude with the DOF of an isolated-line pattern with a gas-phase pretreatment, which is mentioned in the present invention, is shown. A relation of energy latitude to the DOF of a dense-line pattern being treated by using the gas-phase pretreatment is shown in FIG. 9. The DOF of an isolated-line pattern being treated by using the gas-phase pretreatment is larger than that not being treated. The DOF of an dense-line pattern being treated by using a gas-phase pretreatment is as large as the DOF of an dense-line pattern not being treated by using any surface treatment. Thus, to perform a gas-phase pretreatment on a photoresist could increase the DOF of an isolated-line pattern during the photolithography process, and the DOF of an dense-line pattern is not changed.

Figure 1:
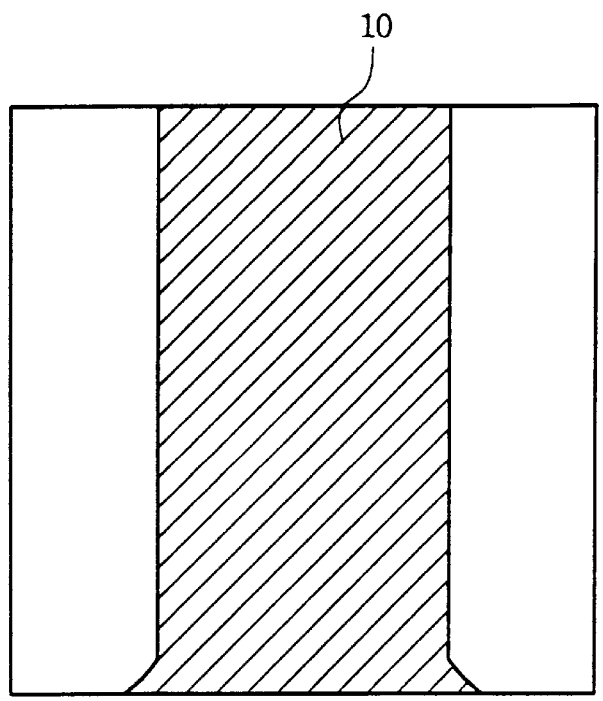
FIG. 1 shows a profile of a photoresist layer, which is exposed and then developed without any pretreatment before exposed in accordance with prior art.
Figure 2:
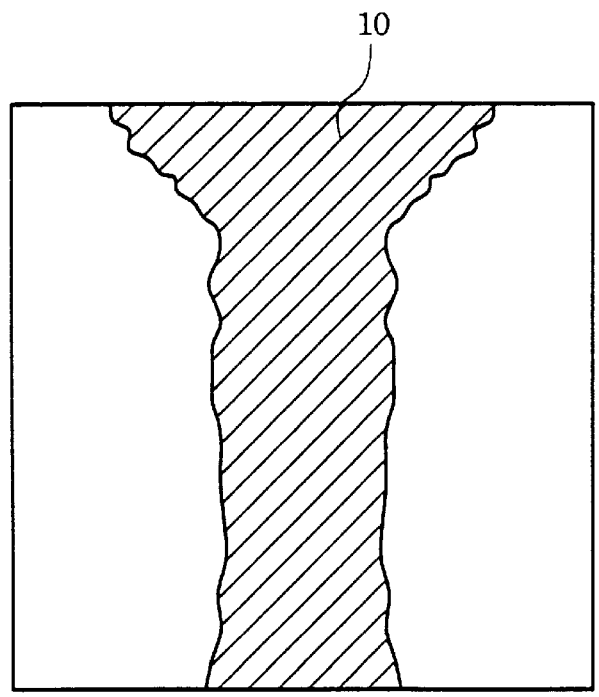
FIG. 2 shows a profile of a photoresist layer, which is exposed and then developed with a liquid-phase pretreatment before it is exposed in accordance with prior art.
Figure 10:
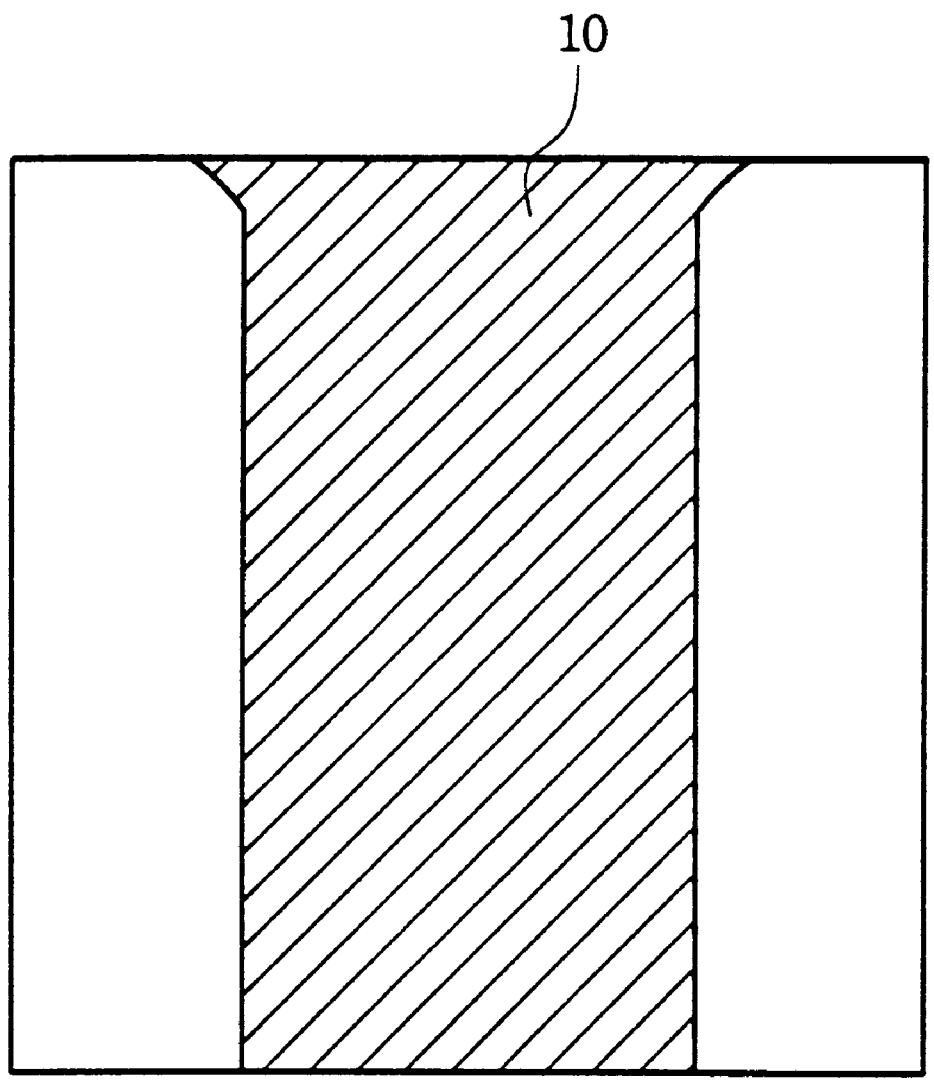
FIG. 10 shows the profile of a photoresist layer, which is exposed and then developed with a gas-phase pretreatment before the photoresist layer is exposed in accordance with the present invention.

Referring to FIG. 10, a cross sectional view's of a photoresist layer 10, which is treated by using the gas-phase pretreatment, is shown. In FIG. 10, the photoresist layer 10 has a sharp and planar profile, which is easy to being aligned and to control the critical dimension of a pattern under the photoresist layer 10 during etching process. The profile according to FIG. 10 differs from the profile according to FIG. 1 and FIG. 2. It means that the gas-phase pretreatment could improve the profile of the photoresist layer after developing process.

While the preferred embodiment of the invention has been illustrated and described, it will be appreciated that various changes can be made therein without departing from the spirit and scope of the invention.

What is claimed is:

1. A lithography process for forming a pattern on a substrate, consisting of the following steps:

applying a resist layer on said substrate;

performing a soft-bake process on said resist layer;

performing an exposure process on said resist layer;

performing a gas-phase treatment on said resist layer for hardening a surface of said resist layer and increasing the depth of focus (DOF), and thereafter performing a post-exposed bake process on said resist layer; and performing a developing process on said resist layer to form said pattern on said substrate.

2. The process according to claim 1, wherein said resist layer comprises negative photoresist.

3. The process according to claim 1, wherein said resist layer comprises positive photoresist.

4. The process according to claim 1, wherein said gas-phase treatment is performed in an ambient of base gas.

5. The process according to claim 4, wherein said gas-phase treatment is performed in said base gas having a concentration between about $10^{-3}$ ppm and 10 mole/cm$^3$.

6. The process according to claim 4, wherein said base gas comprises amine (NH$_3$) gas.

7. The process according to claim 1, wherein said gas-phase treatment is performed at a temperature between about 15 and 250 centigrade degrees.

8. The process according to claim 1, wherein said gas-phase treatment has a processing time between about 1 and 120 seconds.

* * * * *